United States Patent
Du et al.

(10) Patent No.: US 7,701,216 B2
(45) Date of Patent: Apr. 20, 2010

(54) WHOLE BODY COIL ASSEMBLY FOR MAGNETIC RESONANCE IMAGING APPARATUS

(75) Inventors: Jian Jun Du, Shenzhen (CN); Jian Hua Pei, Shenzhen (CN); Yao Xing, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/112,236

(22) Filed: Apr. 30, 2008

(65) Prior Publication Data

US 2008/0265891 A1 Oct. 30, 2008

(30) Foreign Application Priority Data

Apr. 30, 2007 (CN) .................. 2007 2 0149028 U

(51) Int. Cl.
*G01V 3/00* (2006.01)
(52) U.S. Cl. ....................... 324/318; 324/321
(58) Field of Classification Search ......... 324/300–322; 600/410, 422; 333/219, 219.1, 222, 226, 333/227, 235; 335/296, 299, 301
See application file for complete search history.

(56) References Cited

U.S. PATENT DOCUMENTS

| 2,181,871 | A | * | 12/1939 | Conklin ........................ 333/226 |
|---|---|---|---|---|
| 2,619,620 | A | * | 11/1952 | Tapp et al. ................... 318/606 |
| 4,714,886 | A | * | 12/1987 | Halpern ....................... 324/316 |
| 5,049,821 | A | * | 9/1991 | Duensing et al. ............. 324/322 |
| 5,194,811 | A | * | 3/1993 | Murphy-Boesch et al. .. 324/322 |
| 5,202,635 | A | * | 4/1993 | Srinivasan et al. ........... 324/322 |
| 5,212,450 | A | * | 5/1993 | Murphy-Boesch et al. .. 324/322 |
| 5,372,137 | A | * | 12/1994 | Wong et al. .................. 600/422 |
| 5,474,069 | A | * | 12/1995 | Wong et al. .................. 324/322 |
| 5,619,996 | A | * | 4/1997 | Beresten ...................... 324/318 |
| 6,011,393 | A | * | 1/2000 | Kaufman et al. ............. 324/318 |
| 6,294,972 | B1 | * | 9/2001 | Jesmanowicz et al. ....... 335/301 |
| 6,590,393 | B2 | * | 7/2003 | Vaughn et al. ............... 324/322 |
| 2002/0050818 | A1 | * | 5/2002 | Vaughn et al. ............... 324/318 |
| 2007/0001676 | A1 | * | 1/2007 | Schilling et al. ............. 324/322 |
| 2008/0265891 | A1 | * | 10/2008 | Du et al. ...................... 324/318 |
| 2009/0099444 | A1 | * | 4/2009 | Bogdanov .................... 600/422 |

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

To reduce high SAR values in the field of magnetic resonance imaging, and particularly with a whole body coil assembly for an MRI apparatus, at least a bracket is added between the supporting tube of a whole body coil assembly and the connecting copper sheet in order to radially raise the connecting copper sheet and the capacitors away from the human body. In addition to effectively solving the problem of a high SAR value, at the same time no significant loss of the imaging performance occurs. Moreover, the structure is simple, so the costs of modification or production are low.

11 Claims, 3 Drawing Sheets

WHOLE BODY COIL ASSEMBLY FOR MAGNETIC RESONANCE IMAGING APPARATUS

BACKGROUND OF THE INVENTION

1. Field of the Invention

The present invention relates to the field of magnetic resonance imaging, and particularly to a body coil for a magnetic resonance imaging apparatus.

2. Description of the Prior Art

Magnetic resonance imaging (MRI) makes use of the phenomenon of nuclear magnetic resonance (NMR); according to different attenuation rates of released energy in different structural environments inside an object, and by way of an externally applied gradient magnetic field for detecting electromagnetic waves transmitted therefrom, it can acquire the knowledge of the positions and species of the atomic nuclei composing the object, and based on this it can draw images of the internal structure of the object.

MRI devices are widely used in examination and treatments in clinical medicine and an MRI device in the prior art mainly comprises a frame, a patient bed, a gradient coil, a radio frequency (RF) coil and a control and image reconstruction system. When imaging a trunk part, a body coil is used to transmit and/or receive RF pulse signals. FIG. 1 shows a patient bed 1, a gradient coil 2 and a body coil having a supporting tube 3, a plurality of capacitors 4, a connecting copper sheet 5 and a longitudinal copper sheet 6; the gradient coil 2 generates a gradient magnetic field, a patient lies on the patient bed 1 positioned at the center of the body coil; the longitudinal copper sheet 6 and the connecting copper sheet 5 are bonded on the supporting tube 3, the plurality of capacitors 4 are connected in series by the connecting copper sheet 5, and the connection of said connecting copper sheet 5 is broken at the positions of the capacitors 4, with the longitudinal copper sheet 6 connected to the capacitors 4 by the connecting copper sheet 5, so that the supporting tube 3, the capacitors 4, the connecting copper sheet 5 and the longitudinal copper sheet 6 form the body coil, which is mainly used for generating an RF field. In a prior art MRI system, a human body absorbs a part of the RF power, which is measured by a special absorption rate (SAR). If the transmitting power of the RF coil is relatively large, after having scanned for a period of time, the local surface temperature on the human body will rise under the effects of an electric field. According to $U=I*Z$, wherein U is the voltage of capacitors, I is the current flowing through the capacitors, Z is the impedance of the capacitors, and with I as a constant, the larger the impedance Z and the larger the voltage, then the higher the intensity of the RF field generated between the human body and the capacitors, the larger is the current induced on the skin of the human body, and the larger is the SAR; and the smaller the impedance and the smaller the voltage, then the lower the intensity of the RF field generated between the human body and the capacitors, the smaller is the current induced on the skin of the human body and the smaller is the SAR. Therefore, the impedance Z of the capacitors 4 affects the intensity of the RF field in its vicinity, which in turn affects the current induced on the human body and the human body's SAR. The capacitor's value C is in an inverse proportion to its impedance Z, therefore, if the value of the capacitor is large and the impedance small, the current of the human body generated under the intensity of the RF field is small; and if the value of the capacitor is small, the impedance is large and the intensity of the RF field nearby is large, then the induced current on the human body generated under the intensity of the RF field is large. The SAR of human body increases with the increasing intensity of the RF field on the surface skin, and decreases with the decreasing intensity of the RF field on the surface skin. Under normal circumstances, a patient is positioned in the middle of the supporting tube 3, so the shoulder and the abdomen parts of the patient are closer to the capacitors 4, therefore the SARs at the shoulder and abdomen parts are relatively high, and the local temperature at these parts may be increased. Some patients feel nervous or are concerned at such local temperature rise. In some prior art MRI devices, attempts have been made to avoid any significant temperature rise by way of increasing the capacitance and reducing the impedance. However, changes to the capacitance can lead to the changes in coil parameters, making the adjustments rather complicated.

SUMMARY OF THE INVENTION

In order to resolve the aforementioned problems, an object of the present invention is to provide a whole body coil assembly for an MRI apparatus, in which the local temperature increase in a human body and the SAR are reduced in a simple manner without affecting the imaging results.

A whole body coil assembly for an MRI apparatus in accordance with the invention has a supporting tube, a number of capacitors, a connecting copper sheet and a longitudinal copper sheet, wherein the longitudinal copper sheet and connecting copper are fixed on the supporting tube with the capacitors connected in series by the connecting copper sheet; and at least one bracket positioned between the supporting tube and the connecting copper sheet for raising the capacitor axially away from a human body.

According to one aspect of the invention, the contact surface between the bracket and the supporting tube is an arc surface, and the contact surface between the bracket and the connecting copper sheet is an arc surface.

According to another aspect of the invention, the bracket makes the capacitor raise 5-10 mm higher than its original position.

According to another aspect of the invention, the bracket and the supporting tube are connected by a non-metal screw.

According to another aspect of the invention, the bracket and the supporting tube are connected by adhesive bonding.

According to another aspect of the invention, the bracket is hollow.

According to another aspect of the invention, the dielectric coefficient of the material of the bracket is close to 1.

According to another aspect of the invention, the bracket is located between the connecting copper sheet and the supporting tube of the capacitor that is closest to the patient's body.

According to another aspect of the invention, the bracket is located at the capacitor corresponding to the parts of the patient's abdomen or shoulder.

An advantage of the invention is that the problem of high SAR value can be solved effectively and at the same time without a big loss of imaging performance; moreover, the structure is simple and the costs for modifications or production are very low.

DESCRIPTION OF THE PREFERRED EMBODIMENTS

The cross sections of the connecting copper sheet and the supporting tube in the prior art are both circular in shape, and since the connecting copper sheet is very thin, the connecting tube and the supporting tube can be considered as being of equal diameters, and the connecting copper sheet and various distribution capacitors connected thereby are at an equal distance to the center of the body coil. Due to the feature that the SAR decreases dramatically with the increase in the distance to the capacitors, if the capacitors of relatively high SAR values and their corresponding connecting copper sheets are lifted higher, so as to slightly increase the radial distance between the capacitors and the human body, then the SAR of these parts will be reduced significantly. And at the same time, increasing the radial distance between the capacitors and the human body can only reduce the intensity of the RF field between the human body and the capacitors, which has no impact on the intensity of the RF field of the whole imaging body coil, therefore the influence on the signal-to noise ratio (SNR) of the imaging in this area is limited and the MRI imaging results will not be affected very much.

Figure 1:
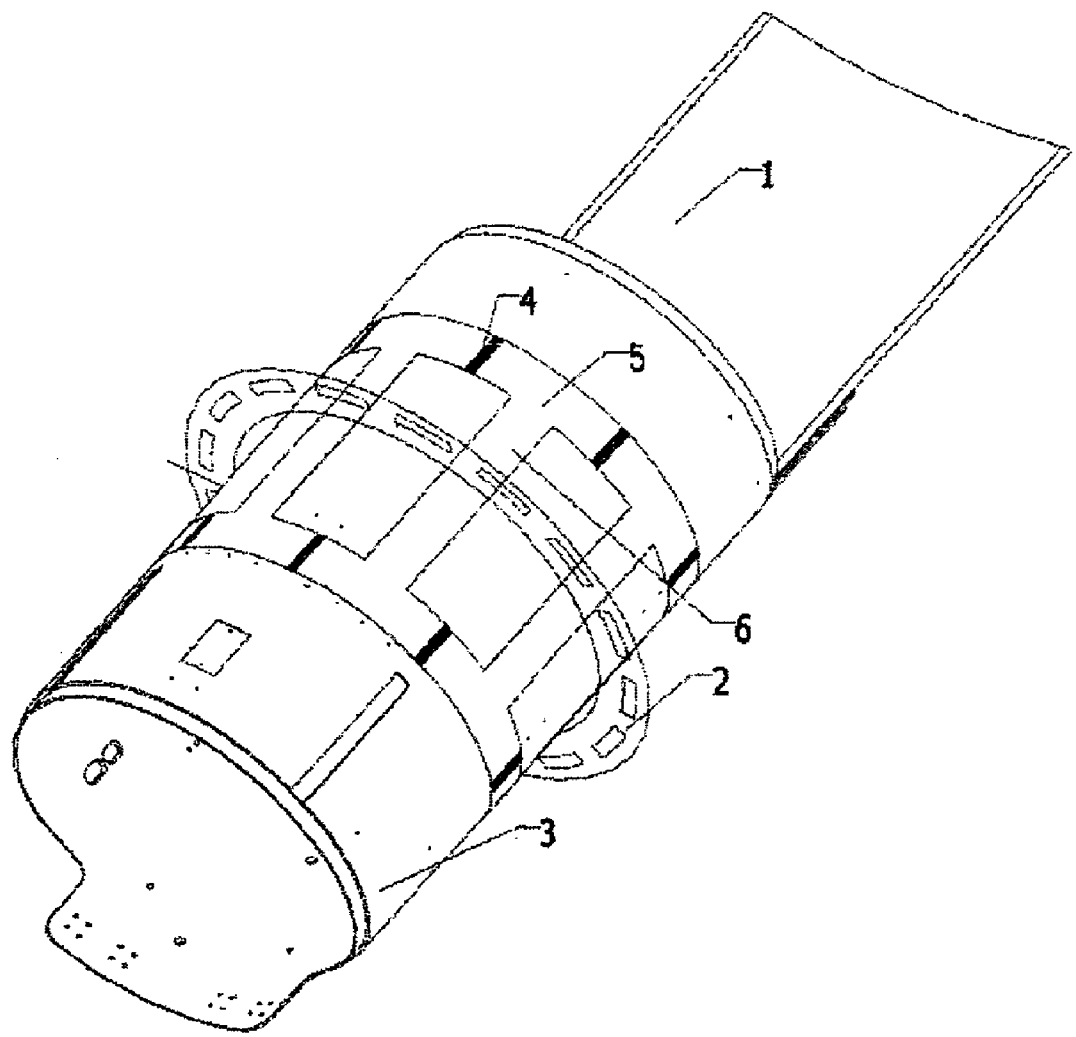
FIG. 1 is a schematic view of a whole body coil assembly for MRI in the prior art.
Figures 2A, 2B:
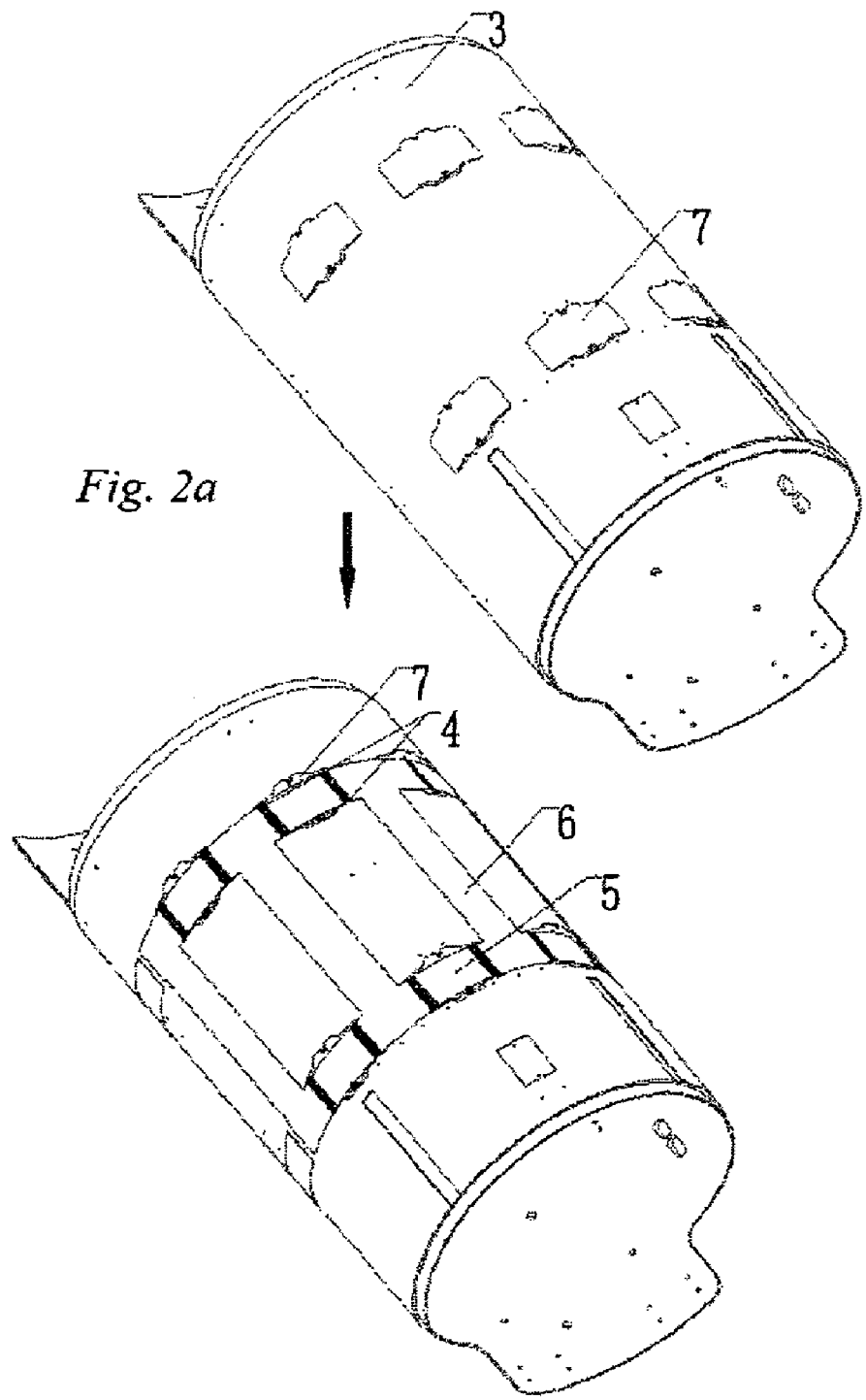
FIGS. 2*a* and 2*b* are schematic structural views of the whole body coil assembly according to the invention.

FIGS. 2a and 2b show schematic structural views of the invention. In a prior art MRI framework, a longitudinal copper sheet 6 and a connecting copper sheet 5 are arranged at the outer side of a supporting tube 3, the connecting copper sheet 5 is distributed and connected to a number of capacitors 4, at least one bracket 7 is situated between the connecting copper sheet 5 and the supporting tube 3, these brackets 7 are used to raise the capacitors 4 in the areas of high SARs and the corresponding connecting copper sheet 5 connected to the capacitors 4, to make the capacitors 4 in these areas and the connecting copper sheet 5 slightly further away from the human body, so as to reduce the SARs of these areas. These brackets 7 are fixed on the supporting tube 3 located below the capacitors 4 and the connecting copper sheet 5, and non-metal screws can be used for fixing said brackets 7 to the supporting tube 3, and these brackets 7 and the connecting copper sheet 5 can also be connected by way of adhesive bonding. The bracket 7 is made by selecting a material with a dielectric coefficient of close to 1 (that is, a material whose dielectric coefficient is close to that of air), therefore the material of said bracket should not be one which affects the intensity of the RF field, for example, the material should not be a metal or a material containing water, and it is preferable to use a hard polyurethane foamed plastic (hard PUR), the shape of the bracket 7 is convex in its middle and is hollow, and a hollow bracket 7 can block the RF field intensity as little as possible; the height of the bracket 7 is such to move the capacitors 4 radially away from the human body by 5-10 mm. Since a bracket having sharp edges and corners may create edges and dents on the connecting copper sheet and such edges and dents on the connecting copper sheet will emit electromagnetic waves which affect the RF field of the body coil, the configuration of the bracket 7 should be formed by smooth surfaces to avoid interference to the density of the RF field. Preferably, the contact surface between the bracket 7 and the connecting copper sheet 5 is in an arc shape. Optionally, the bracket 7 can be of other shapes in order to raise said capacitors 4 by a certain radial distance.

Figure 3A:
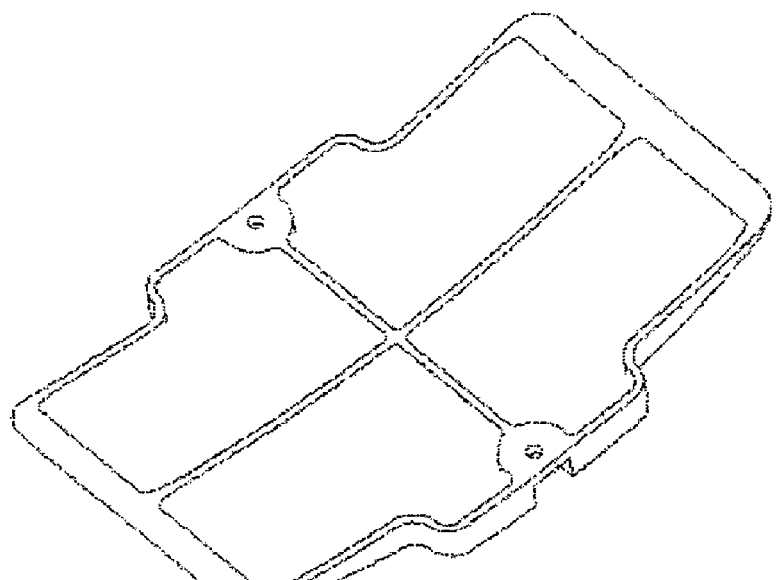
FIGS. 3a-3c are schematic structural views of the bracket of the whole body coil assembly according to the present invention.
Figure 3B:
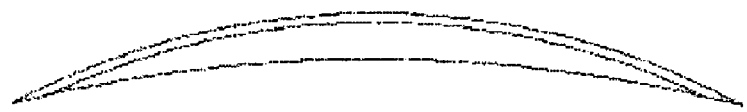
Figure 3C:
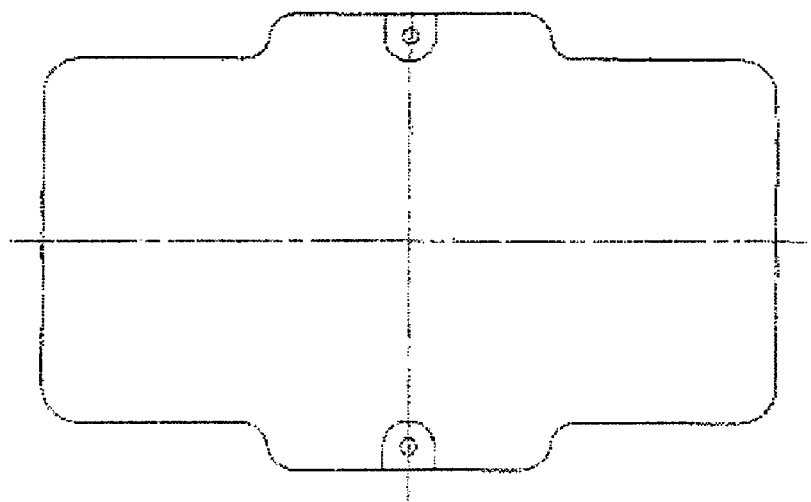

FIGS. 3a-3c are schematic structural views of the bracket 7 according to the present utility model, among them FIG. 3a is a perspective view of the bracket 7 according to the present utility model, with its bottom facing upwards, FIG. 3b is a cross-sectional view of the bracket 7, and FIG. 3c is a plan view of the bracket 7.

When a patient is positioned in said framework, usually areas of high SAR would appear on the human body at the shoulder, arm, stomach, etc., so said brackets 7 are fitted at the relevant positions of the supporting tube 3 corresponding to these body parts. Preferably, if high SAR only appears at the stomach, then the bracket 7 is only fitted below the connecting copper sheet 5, which is above the supporting tube 3, so as to raise the capacitor 4 at this location.

The invention can also be used in the solution for increasing the value of capacitors described in the background art. If the capacitance value of the area of high SAR is increased, the SAR of this area will decrease, and in order to meet the requirements of the MRI imaging to the RF field intensity, the value of one of the other capacitors needs to be reduced to maintain the performance of the whole RF field, but then the SAR of the area with reduced capacitance will become bigger than that before the adjustment. In accordance with the invention, a bracket is added between the connecting copper sheet and the supporting tube to raise the capacitor corresponding to the area of a high SAR after the adjustment, so as to make it slightly further away from the human body, then at the same time as reducing the SAR the human body it will not cause too much loss of the imaging quality.

A benefit of the invention is that, since the RF field intensity of an area close to a capacitor is large and the RF field intensity of the area far away from a capacitor is small, the problem of a high SAR value can be effectively solved by adjusting the distance between a capacitor and the skin of a human body, and at the same time it will not cause much loss in the imaging performance; moreover, the structure is simple, so the costs of modification or production are low.

Although modifications and changes may be suggested by those skilled in the art, it is the intention of the inventors to embody within the patent warranted hereon all changes and modifications as reasonably and properly come within the scope of their contribution to the art.

We claim as our invention:

1. A whole body coil assembly configured for a magnetic resonance imaging apparatus, comprising:
   a supporting tube component having a tube body with at least a portion of said tube body configured to completely surround and enclose the whole body of an examination subject inside the tube body;
   a plurality of capacitors;
   a connecting copper sheet, separate from said tube component, having a copper sheet shape conforming to a shape of the tube body;
   a longitudinal copper sheet, separate from said tube component, having a longitudinal copper sheet shape conforming to the shape of the tube body;
   said connecting copper sheet, said capacitors and said longitudinal copper sheet forming a whole body coil that is fixed on and carried by said supporting tube body component, and said capacitors being connected in series by said connecting copper sheet; and
   at least one bracket disposed between said supporting tube body component and said connecting copper sheet that raises said capacitors in a radial direction away from a body surface of the examination subject within the tube body.

2. A whole body coil assembly as claimed in claim 1 wherein said tube body has a longitudinal axis and a generally circular shape in planes orthogonal to said longitudinal axis.

3. A whole body coil assembly as claimed in claim 2 wherein said bracket and supporting tube component have a first contact surface therebetween that is arcuate, and wherein said bracket and said connecting copper sheet have a second contact surface therebetween that is arcuate.

4. A whole body coil assembly as claimed in claim 3 wherein said at least one bracket raises said capacitors by a distance in a range between 5 to 10 mm.

5. A whole body coil assembly as claimed in claim 1 wherein said at least one bracket is connected to said supporting tube by a non-metallic screw.

6. A whole body coil assembly as claimed in claim 1 comprising adhesive bonding connecting said at least 1 bracket to said connecting copper sheet.

7. A whole body coil assembly as claimed in claim 1 wherein said at least one bracket is hollow.

8. A whole body coil assembly as claimed in claim 1 wherein said bracket is comprised of material having a dielectric coefficient substantially equal to 1.

9. A whole body coil assembly as claimed in claim 1 wherein said plurality of capacitors include a capacitor that is located closest to said body surface, said at least one bracket being located between said connecting copper sheet and said supporting tube at said capacitor.

10. A whole body coil assembly as claimed in claim 1 wherein said plurality of capacitors include a capacitor that is located at the abdomen of the subject, said at least one bracket being located between the connecting copper sheet and said supporting tube at said capacitor.

11. A whole body coil assembly as claimed in claim 1 wherein said plurality of capacitors include a capacitor that is located at the shoulder of the subject, said at least one bracket being located between the connecting copper sheet and said supporting tube at said capacitor.

* * * * *